(12) United States Patent
Colombo

(10) Patent No.: US 12,135,351 B2
(45) Date of Patent: Nov. 5, 2024

(54) DFT ARCHITECTURE FOR ANALOG CIRCUITS

(71) Applicant: STMicroelectronics S.r.l., Agrate Brianza (IT)

(72) Inventor: Filippo Colombo, Monza (IT)

(73) Assignee: STMicroelectronics S.r.l., Agrate Brianza (IT)

(*) Notice: Subject to any disclaimer, the term of this patent is extended or adjusted under 35 U.S.C. 154(b) by 352 days.

(21) Appl. No.: 17/592,171

(22) Filed: Feb. 3, 2022

(65) Prior Publication Data
US 2023/0243886 A1 Aug. 3, 2023

(51) Int. Cl.
G01R 31/316 (2006.01)
G01R 31/317 (2006.01)

(52) U.S. Cl.
CPC ..... *G01R 31/316* (2013.01); *G01R 31/31704* (2013.01)

(58) Field of Classification Search
CPC .............. G01R 31/2284; G01R 31/316; G01R 31/3167; G01R 31/31704; G01R 31/31724; G03M 1/108
USPC ..................................................... 324/750.3
See application file for complete search history.

(56) References Cited

U.S. PATENT DOCUMENTS

| | | |
|---|---|---|
| 5,898,703 A | 4/1999 | Lin |
| 6,714,888 B2 | 3/2004 | Mori et al. |
| 7,143,374 B1 | 11/2006 | Keller et al. |
| 7,181,384 B1 | 2/2007 | Riggs et al. |
| 7,271,751 B2 | 9/2007 | Peterson et al. |
| 7,856,048 B1 | 12/2010 | Smaini et al. |
| 7,856,581 B1 | 12/2010 | Tabatabaei et al. |
| 7,890,822 B2* | 2/2011 | Behziz ............. G01R 31/31922 324/762.02 |

(Continued)

FOREIGN PATENT DOCUMENTS

| | | |
|---|---|---|
| CN | 104716526 A | 6/2015 |
| CN | 210956169 U | 7/2020 |

(Continued)

OTHER PUBLICATIONS

Chandrasekhar, V. et al., "Low-Cost Low-Power Self-Test Design and Verification of On-Chip ADC for System-on-a-Chip Applications," IMTC, IEEE, Apr. 24-27, 2006, 6 pages.

(Continued)

*Primary Examiner* — Eman A Alkafawi
*Assistant Examiner* — Rahul Maini
(74) *Attorney, Agent, or Firm* — Slater Matsil, LLP

(57) ABSTRACT

An integrated circuit (IC) includes: a first functional analog pin or pad; a first analog test bus coupled to the first functional analog pin or pad; first and second analog circuits coupled to the first analog test bus; and a test controller configured to: when the IC is in a functional operating mode, connect an input or output of the first analog circuit to the first analog test bus so that the input or output of the first analog circuit is accessible by the first functional analog pin or pad, and keep disconnected an input or output of the second analog circuit from the first analog test bus, and when the IC is in a test mode, selectively connect the input or output of the first and second analog circuits to the first analog test bus to test the first and second analog circuits using the first analog test bus.

23 Claims, 7 Drawing Sheets

(56) References Cited

U.S. PATENT DOCUMENTS

| | | | |
|---|---|---|---|
| 8,810,268 B2* | 8/2014 | Huang | G09G 3/3685 |
| | | | 324/750.3 |
| 11,038,345 B2 | 6/2021 | Delshadpour et al. | |
| 2001/0016933 A1 | 8/2001 | Chang et al. | |
| 2001/0033583 A1 | 10/2001 | Rabenko et al. | |
| 2002/0094077 A1 | 7/2002 | Kunisch | |
| 2003/0208708 A1 | 11/2003 | Sunter | |
| 2007/0001704 A1* | 1/2007 | O'Mahony | H04L 25/03878 |
| | | | 324/750.3 |
| 2007/0182612 A1* | 8/2007 | Peterson | H03M 1/1071 |
| | | | 324/750.3 |
| 2008/0184184 A1 | 7/2008 | KcCracken et al. | |
| 2010/0235699 A1 | 9/2010 | Terae et al. | |
| 2011/0109321 A1 | 5/2011 | Kawabata et al. | |
| 2011/0156738 A1 | 6/2011 | Jeon et al. | |
| 2011/0241914 A1 | 10/2011 | Lai | |
| 2013/0137381 A1 | 5/2013 | Vassiliou et al. | |
| 2014/0191890 A1 | 7/2014 | Spinks et al. | |
| 2014/0266824 A1 | 9/2014 | Lowney et al. | |
| 2015/0120219 A1 | 4/2015 | Merlin et al. | |
| 2016/0231378 A1 | 8/2016 | Abhishek et al. | |
| 2017/0258362 A1 | 9/2017 | Myers et al. | |
| 2020/0081059 A1* | 3/2020 | Ducrey | G01R 31/31713 |

FOREIGN PATENT DOCUMENTS

| | | |
|---|---|---|
| JP | H0462642 A | 2/1992 |
| JP | H0496144 A | 3/1992 |
| JP | 2000315771 A | 11/2000 |
| JP | 2007178387 A | 7/2007 |
| JP | 2008286699 A | 11/2008 |
| JP | 2012151666 A | 8/2012 |

OTHER PUBLICATIONS

Wikipedia, "Signal Conditioning," https://en.wikipedia.org/w/index.php?title=Signal_conditioning&oldid=758314100, Jan. 4, 2017, 2 pages.

Sunter, Stephen K., et al., "Testing high frequency ADCs and DACs with a low frequency analog bus", Institute of Electrical and Electronics Engineers: Proceedings International Test Conference 2003, Charlotte, NC, Sep. 30-Oct. 2, 2003; [International Test Conference], New York, NY: IEEE, US, vol. 1, Sep. 30, 2003, 8 pages.

Venkatanarayanan, Haro V. et al., "An Area Efficient Mixed-Signal Test Architecture for Systems-on-a-Chip", VLSI Design, 2006. Held Jointly With 5th International Conference On Embedded Systems And Design, 19th International Conference on, Piscataway, NJ, USA, IEEE , Jan. 3, 2006, 8 pages.

* cited by examiner

DFT ARCHITECTURE FOR ANALOG CIRCUITS

TECHNICAL FIELD

The present disclosure relates generally to an electronic system and method, and, in particular embodiments, to a design for testability (DFT) architecture for analog circuits.

BACKGROUND

Analog circuits in an integrated circuit (IC) are generally tested to ensure that the functionality and electrical parameters of such analog circuits meet expectations. Ensuring that an analog circuit meets expectation may be particularly important in automotive ICs, in which complying with standards, such as the automotive safety integrity level (ASIL) risk classification scheme defined by the ISO 26262 standard may be desirable. Thus, it is common for an IC, such as an automotive IC, to include testability features to configure, control, and/or observe one or more aspects of one or more analog circuits of such IC.

Examples of analog circuits of an IC that may be tested include analog-to-digital converters (ADCs), digital-to-analog converters (DACs), comparators, and amplifiers.

An example of a testability feature for testing an analog circuit is the provision of dedicated test registers (e.g., programmable through JTAG) for configuring the analog circuit under test.

Another example of a testability feature for testing an analog circuit is the provision of a dedicated analog test pin for controlling an input or observing an output of the analog circuit under test. For example, if a DAC of an IC is not designed to provide an output to an external pin of the IC during a functional operating mode, the output of such DAC may be routed to a dedicated analog test pin so that it can be observed during test mode. As another example, if an ADC of the IC is not designed to receive an input from an external pin of the IC during a functional operating mode, the input for such ADC may be provided via a dedicated analog test pin that is routed to the input of the ADC during test mode. The dedicated analog test pin is generally grounded during functional operating mode (e.g., grounded in the PCB of the final product, such as soldered and connected to a ground plane of the PCB).

SUMMARY

In accordance with an embodiment, an integrated circuit includes: a first functional analog pin or pad; a first analog test bus coupled to the first functional analog pin or pad; a first analog circuit coupled to the first analog test bus; a second analog circuit coupled to the first analog test bus; and a test controller configured to: when the integrated circuit is in a functional operating mode, connect an input or output of the first analog circuit to the first analog test bus so that the input or output of the first analog circuit is accessible by the first functional analog pin or pad, and keep disconnected an input or output of the second analog circuit from the first analog test bus, and when the integrated circuit is in a test mode, selectively connect the input or output of the first and second analog circuits to the first analog test bus to test the first and second analog circuits using the first analog test bus.

In accordance with an embodiment, an integrated circuit includes: first and second functional analog pins or pads; first and second analog test buses respectively coupled to the first and second functional analog pins or pads; a first digital-to-analog converter (DAC) having an output coupled to the first analog test bus; a second DAC having an output coupled to the second analog test bus; a differential analog-to-digital converter (ADC) having a first input coupled to the first analog test bus and a second input coupled to the second analog test bus; and a test controller configured to: when the integrated circuit is in a functional operating mode, connect the output of the first DAC to the first analog test bus so that the output of the first DAC is accessible by the first functional analog pin or pad, connect the output of the second DAC to the second analog test bus so that the output of the second DAC is accessible by the second functional analog pin or pad, and keep disconnected the first and second inputs of the differential ADC from the first and second analog test buses, respectively, and when the integrated circuit is in a test mode, connect the first and second inputs of the differential ADC to the first and second analog test buses, respectively, provide first and second analog signals to the first and second analog test buses using the first and second DACs, respectively, and determine whether the first DAC, the second DAC, or the differential ADC has a fault based on an output of the differential ADC.

In accordance with an embodiment, a method includes: when an integrated circuit is in a non-test mode, connect an input or output of a first analog circuit to a first analog test bus that is coupled to a first functional analog pin or pad so that the input or output of the first analog circuit is accessible by the first functional analog pin or pad, and keep disconnected an input or output of a second analog circuit from the first analog test bus; and when the integrated circuit is in a test mode, selectively connect the input or output of the first and second analog circuits to the first analog test bus to test the first and second analog circuits using the first analog test bus.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise

DETAILED DESCRIPTION OF ILLUSTRATIVE EMBODIMENTS

Figure 1:
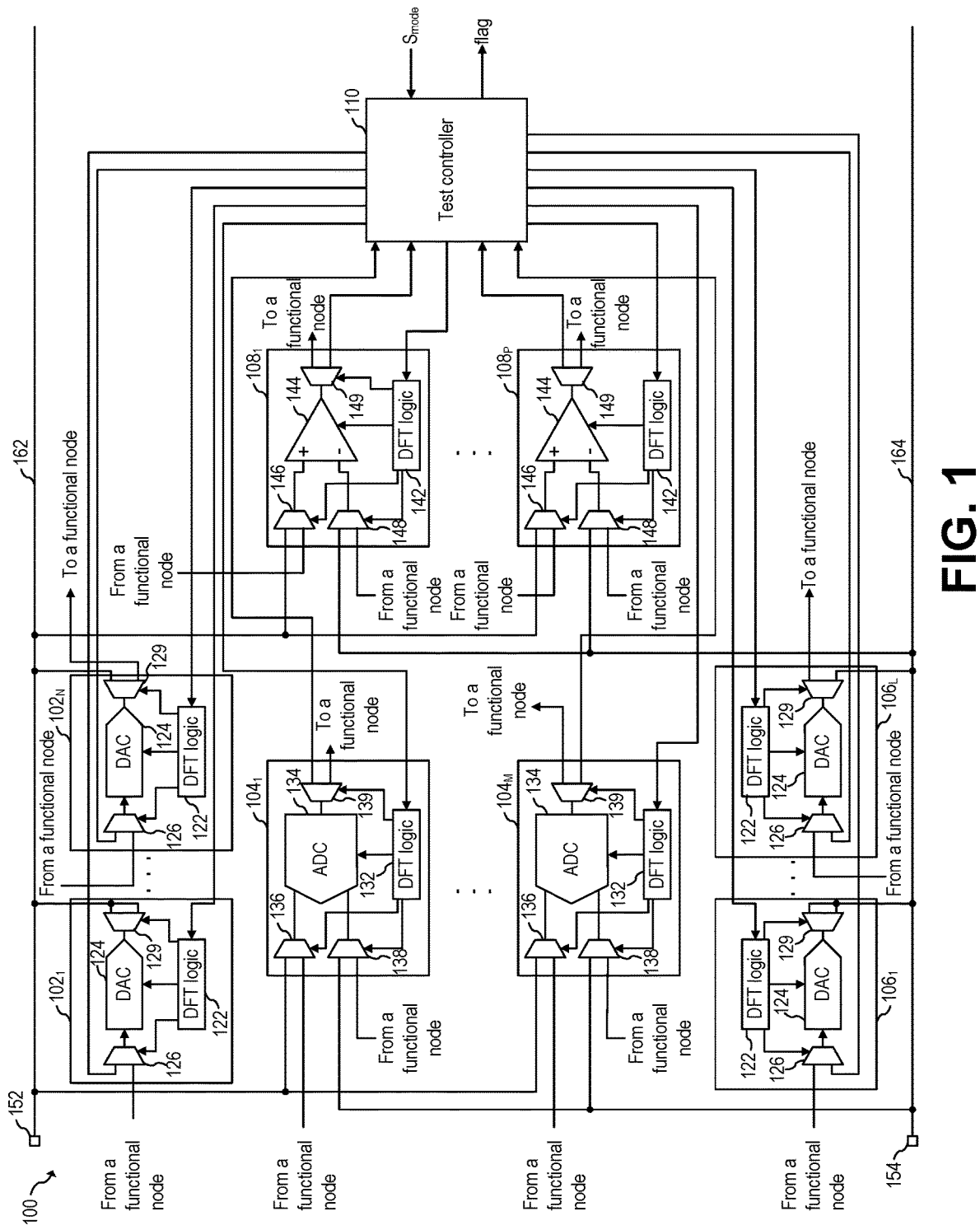
FIG. 1 shows a schematic diagram of a portion of an IC, according to an embodiment of the present invention.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, e.g., a DFT architecture for testing analog circuits such as DACs, ADCs, and comparators. In some embodiments, the DFT architecture may be used for testing other types of analog circuits, such as temperature sensors, and bias generators.

The growing complexity of ICs, such as automotive ICs, and the high level of expected quality of such ICs may cause an increase in dedicated testability resources in the IC. For example, a complex system-on-chip (SoC), such as an automotive-grade microcontroller IC, may include multiple dedicated analog test pins (e.g., dedicated pins designed for the application of analog signals as inputs to an analog circuit under test or for observing analog signals outputted from an analog circuit under test) for testing a plurality of analog circuits of the complex SoC. It may be desirable to reduce the number of pins of an IC (e.g., to achieve a target die area or form factor). It may also be desirable to reduce the test time associated with testing the plurality of analog circuits of the SoC In an embodiment of the present invention, a functional analog pin (a pin designed to operate as an analog line during normal operation) of the IC is also used during test mode for the routing of analog test signals for testing one or more DACs, ADCs and comparators. The functional analog pin is connected to an analog test bus. The analog test bus is connected to inputs of the one or more ADCs and comparators and to outputs of the one or more DACs. During a functional operating mode (not in test mode), the functional analog pin serves as a functional analog pin for one of the one or more DACs, ADCs, and comparators. During test mode, the functional analog pin operates as an output for observing the output of the analog test bus, or as an input to the analog test bus. In some embodiments, an analog signal from the analog test bus (e.g., originating from one of the one or more DACs) is observed at the functional analog pin during test mode. In some embodiments, an analog signal from the analog test bus (originating from the functional analog pin or from an output of one of the one or more DACs) serve as inputs to the one or more ADCs and comparators, e.g., to test the one or more ADCs and comparators in parallel.

By reusing a functional analog pin for test purposes of one or more ADCs, DACs, and comparators, some embodiments advantageously avoid the need of including a dedicated analog test pin for testing the one or more ADCs, DACs, and comparators, thereby advantageously reusing test pin overhead.

In some embodiments, since a functional analog pin is designed to carry analog signals during functional mode and already includes analog circuits to allow for using the functional analog pin for carrying analog signals, reusing a functional analog pin during test mode for testing one or more analog circuits advantageously results in lower overhead (e.g., lower area) when compared to reusing a functional digital pin (e.g., a GPIO pin) for testing analog circuits. For example, to make a GPIO cell able to carry not only digital signals but also analog signals it may be necessary to add a dedicated analog line inside the cell (properly dimensioned to minimize resistivity and disturbs), protected with ESD structures and also to add logic to disable (for analog mode functionality) both digital input/output buffers and pull-up/pull-down circuits, if not already present.

By connecting the functional analog test bus to inputs of a plurality of ADCs and comparators, some embodiments advantageously achieve test parallelism, thereby advantageously reducing test time. By using an analog test bus connected between outputs of the one or more DACs and inputs of the one or more ADCs and comparators, some embodiments advantageously allow for built-in self-test (BIST) solutions, where the output of one of the one or more DACs is used to test the one or more ADCs and comparators, advantageously without intervention from automatic test equipment (ATE).

FIG. 1 shows a schematic diagram of a portion of IC 100, according to an embodiment of the present invention. IC 100 includes pads 152 and 154, analog test buses 162 and 164, N DAC modules 102 (where N is greater than or equal to 1), L DAC modules 106 (where L is greater than or equal to 1), M ADC modules 104 (where M is greater than or equal to 1), P comparators modules 108 (where P is greater than or equal to 1) and test controller 110.

In some embodiments, IC 100 is packaged such that pads 152 and 154 are coupled to corresponding pins 152 and 154 of IC 100, e.g., via bond wires.

In some embodiments, pads or pins 152 and 154 are functional pads or pins accessible during a functional operating mode of IC 100. For example, in some embodiments, during a functional operating mode, pad or pin 152 provides an output of one of the N DAC modules 102 and pad or pin 154 provides an output of one of the L DAC modules 106. In some embodiments, during a functional operating mode pads or pins 152 and 154 provide a differential input to one of the M ADC modules 104 or to one of the P comparator modules 108.

In the embodiment shown in FIG. 1, a functional operating mode, the output of DAC 124 of DAC module $102_1$ is connected to pad or pin 152 a functional operating mode, and the output of DAC 124 of DAC module $106_1$ is connected to pad or pin 154. During a functional operating mode, the outputs of DACs 124 of DAC modules $102_2$ to $102_N$ are not connected to analog test bus 162 (e.g., the outputs of such DACs 124 are in hi-Z or are routed to a functional node by demultiplexer 129), the outputs of DACs 124 of DAC modules 106₂ to 102_L are not connected to analog test bus 164 (e.g., the outputs of such DACs 124 are in hi-Z or are routed to a functional node by demultiplexer 129), and multiplexers (MUXes) 136, 138, 146, and 148 are configured to select the input coupled to the respective functional nodes instead of selecting the input from the associated analog test bus (e.g., 162, 164).

In the embodiments shown in FIG. 1, the output of DAC 124 of module 102₁ and the output of DAC 124 of module 106₁ are respectively connected to analog test buses 162 and 164 via respectively demultiplexers 129. In some embodiments, since the outputs of the demultiplexers 129 of DAC modules 102₁ and 106₁ are shorted, the demultiplexers 129 of modules 102₁ and 106₁ may be omitted, and the DAC outputs of modules 102₁ and 106₁ may be directly connected to analog test buses 162 and 164, respectively.

As will be described in more detail below, during test mode of IC 100, test controller no controls modules 102, 104, 106, and 108 to selectively connect outputs of DACs 124, and/or inputs of ADCs 134 and/or comparators 144 to analog test buses 162 and 164 and perform one or more tests to test one or more of modules 102, 104, 106, and 108.

In some embodiments, each of ADC modules 104 includes an ADC 134, MUXes 136 and 138, demultiplexer 139, and DFT logic circuit 132. ADC 134 is configured to provide a digital code in a known manner based on the input voltages provided by the outputs of MUXes 136 and 138. DFT logic circuit 132 is configured to cause MUXes 136 and 138 to selectively connect the inputs of ADC 134 to functional nodes or to the analog test buses 162 and 164 based on an output from test controller 110. In some embodiments, DFT logic circuit 132 is configure to cause demultiplexer 139 to selectively connect the output of ADC 134 to a functional node or to the test controller 110 based on an output of test controller 110. In some embodiments, DFT logic circuit 132 may be implemented, e.g., with digital circuits, such as using combinatorial logic. In some embodiments, MUXes 136 and 138 may be implemented in any way known in the art. In some embodiments, demultiplexer 139 may be implemented in any way known in the art. In some embodiments, ADC 134 may be implemented in any way known in the art.

Examples of functional nodes that may be connected to an input of one or more of MUXes 136 and 138 include nodes internal to IC 100 having a voltage to be converted into a digital code by an ADC 134 during functional operating mode (i.e., not in test mode). Examples of functional nodes that may be connected to an output of demultiplexer 139 include a digital bus, a register, etc.

In some embodiments (such as shown in FIG. 1), ADC 134 is a differential ADC. In some embodiments, ADC 134 may be implemented as a single-ended ADC.

In some embodiments, (such as shown in FIG. 1), each of the ADCs 134 of each of ADC modules 104 is similar or identical to each other. In some embodiments, one or more ADCs of ADC modules 104 may be different (e.g., may have different resolution, may be single-ended versus differential, may operate with a different sampling rate, etc.).

In some embodiments, each of DAC modules 102 and 106 includes a DAC 124, a MUX 126, demultiplexer 129, and DFT logic circuit 122. DAC 124 is configured to provide an analog signal (e.g., voltage) in a known manner based on an input code provided by the outputs of MUX 126. DFT logic circuit 122 is configured to cause MUX 126 to selectively connect the inputs of DAC 124 to a functional node or to the test controller 110 based on an output from test controller 110. In some embodiments, digital logic circuit 122 is configured to selectively connect the output of DAC 124 to an analog test bus (e.g., 162, 164) or to a functional node based on an output of test controller 110. In some embodiments, DFT logic circuit 122 may be implemented, e.g., with digital circuits, such as using combinatorial logic. In some embodiments, MUX 126 may be implemented in any way known in the art. In some embodiments, DAC 124 may be implemented in any way known in the art. For example, in some embodiments, DAC 124 may be a buffered DAC. In some embodiments, DAC 124 may be an unbuffered DAC (e.g., a DAC designed to provide an output only internal circuits of IC 100). In some embodiments in which DAC 124 is an unbuffered DAC, an additional injection-proof switch may be added to the output of the DAC so that the DAC has the capability of being placed in hi impedance (hi-Z) and to safely interface with a pin or pad (e.g., 152, 154) of IC 100.

Examples of functional nodes that may be connected to inputs of one or more of MUXes 126 include nodes internal to IC 100 having a digital code (such as a digital bus, a register, etc.) to be converted into a voltage by a DAC 124 during a functional operating mode (i.e., not in test mode). Examples of functional nodes that may be connected to an output of demultiplexer 129 includes inputs of other analog circuits of IC 100, such as amplifiers, comparators, voltage regulators, etc.

In some embodiments, (such as shown in FIG. 1), each of the DACs 124 of each of DAC modules 102 and 106 is similar or identical to each other. In some embodiments, one or more DACs of DAC modules 102 or 106 may be different (e.g., may have different resolution, may operate with a different sampling rate, etc.).

In some embodiments, each of comparator modules 108 includes a comparator 144, MUXes 146 and 148, demultiplexer 149, and DFT logic circuit 142. Comparator 144 is configured to provide an output (e.g., high/low) in a known manner based on the input voltages provided by the outputs of MUXes 146 and 148. DFT logic circuit 142 is configured to cause MUXes 146 and 148 to selectively connect the inputs of comparator 144 to functional nodes or to the analog test buses 162 and 164 based on an output of test controller 110. In some embodiments, DFT logic circuit 142 is configured to cause demultiplexer 149 to selectively connect the output of comparator 144 to a functional node or to the test controller no based on an output of test controller 110. In some embodiments, DFT logic circuit 142 may be implemented, e.g., with digital circuits, such as using combinatorial logic. In some embodiments, MUXes 146 and 148 may be implemented in any way known in the art. In some embodiments, comparator 144 may be implemented in any way known in the art.

Examples of functional nodes that may be connected to inputs of one or more of MUXes 146 and 148 include nodes internal to IC 100 having a voltage to be compared against a threshold or to the voltage at another node of IC 100 during functional operating mode (i.e., not in test mode). Examples of functional nodes that may be connected to an output of demultiplexer 149 includes other analog or digital circuits of IC 100, a register bit, etc.

In some embodiments, (such as shown in FIG. 1), each of the comparators 144 of each of comparator module 108 is similar or identical to each other. In some embodiments, one or more comparators of comparator modules 108 may be different (e.g., may have different hysteresis, may operate with different speed, etc.). In some embodiments, comparator 144 may be implemented in any way known in the art.

In some embodiments, (such as shown in FIG. 1), each of the MUXes 136 of modules 104 is similar or identical to each other, each of the MUXes 138 of modules 104 is similar or identical to each other, each of the MUXes 126 of modules 102 or 106 is similar or identical to each other, and each of the MUXes 148 of modules 108 is similar or identical to each other. In some embodiments, one or more MUXes of modules 102, 104, 106, and/or 108 may be different (e.g., may have different number of inputs, etc.).

In some embodiments, (such as shown in FIG. 1), each of the demultiplexers 139 of modules 104 is similar or identical to each other, each of the demultiplexers 129 of modules 102 or 106 is similar or identical to each other, and each of the demultiplexers 149 of modules 108 is similar or identical to each other. In some embodiments, one or more demultiplexers of modules 102, 104, 106, and/or 108 may be different (e.g., may have different number of outputs, etc.).

In some embodiments, test controller 110 is configured to control DFT logic circuits 122, 132, and 142 based on the state of operating mode signal $S_{mode}$. For example, when signal $S_{mode}$ is indicative of a functional operating mode (a non-test mode), test controller 110 configures DFT logic circuits 122, 132, and 142 to cause MUXes 126, 136, 138, 146, and 148, and demultiplexers 129, 139, and 149 to couple the associated DACs 124, ADCs 134 and comparators 144 to respective functional nodes. As will be described in more detail below, when signal $S_{mode}$ is indicative of a test mode, test controller no configures DFT logic circuits 122, 132, and 142 to cause MUXes 126, 136, 138, 146, and 148, and demultiplexers 129, 139, and 149 to couple the associated DACs 124, ADCs 134 and comparators 144 with the associated analog test bus (e.g., 162, 164) and/or to test controller 110 to perform one or more tests.

During test mode, test controller 110 is configured to perform one or more tests to determine whether there is a fault in one or more of DACs 124, ADC 134, and/or comparators 144. In some embodiments, when a fault is detected, test controller 110 is configured to assert a flag indicative that a circuit has failed a test. In some embodiments, the flag may be received by an ATE (not shown) or by a main controller of IC 100 (not shown), and the ATE or main controller may alert a user that a fault has occurred.

In some embodiments, IC 100 may be, e.g., an automotive SoC, such as an automotive micro-controller. In some embodiments, IC 100 may be implemented as other types of IC, such as a mobile power management IC (PMIC).

In some embodiments, IC 100 is packaged such that pads 152 and 154 are coupled to respective pins of IC 100, e.g., via bond wires.

Figure 2:
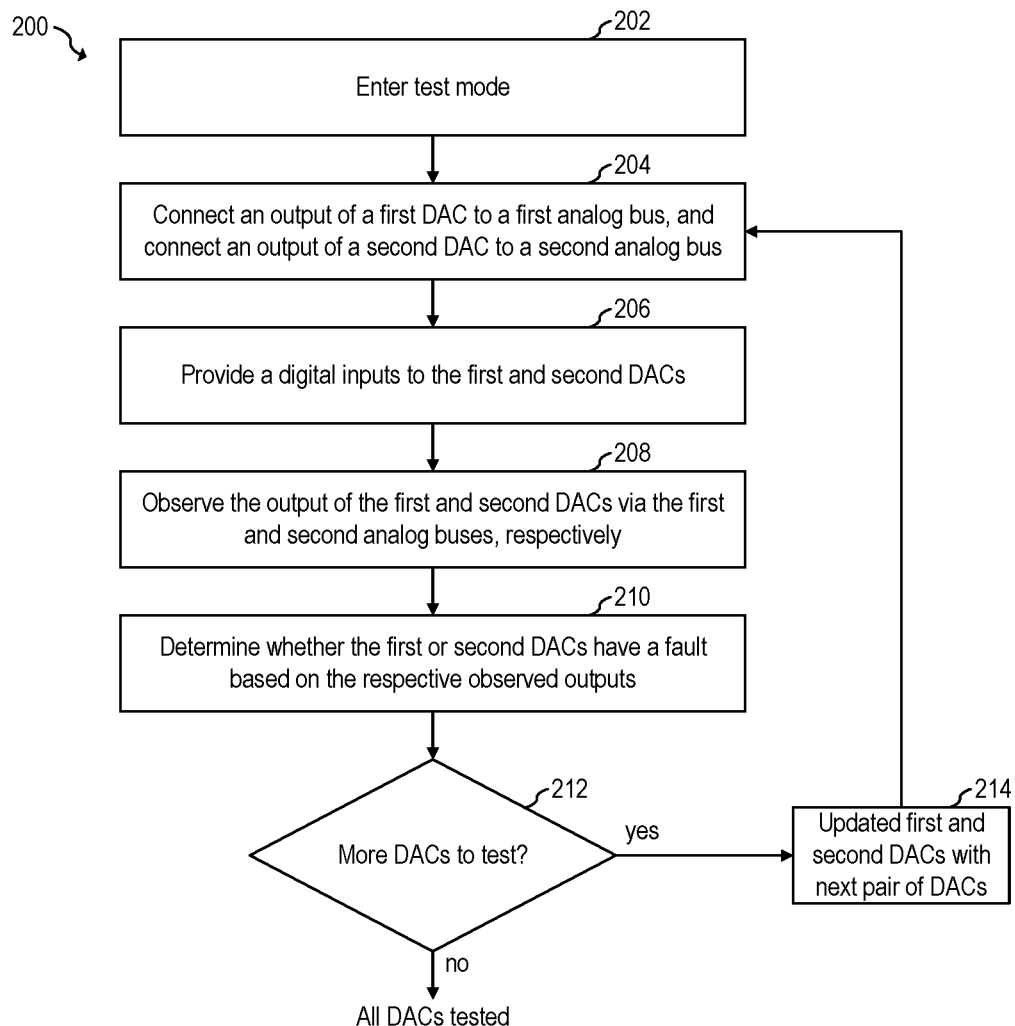
FIG. 2 illustrates a flow chart of an embodiment method for testing two DACs of the IC of FIG. 1 in parallel, according to an embodiment of the present invention.

FIG. 2 illustrates a flow chart of embodiment method 200 for testing two DACs of IC 100 in parallel, according to an embodiment of the present invention. Method 200 includes steps 202, 204, 206, 208, 210, 212, 214. Steps 202, 204, 206, 208, 210, 212, and 214 may be performed by or using test controller 110. In some embodiments, one or more of steps 202, 204, 206, 208, 210, 212, 214 may be performed or caused to be performed by an ATE.

During step 202, an IC to be tested (e.g., 100) enters test mode. For example, in some embodiments a mode signal (e.g., Smode transitions state to indicate that test mode has been entered.

During step 204, an output of a first DAC (e.g., one of the DACs from of DAC modules $102_1$ to $102_N$) is connected to a first analog test bus (e.g., 162), e.g., via a demultiplexer (e.g., 129), while the outputs of the other DACs (e.g., of DAC modules 102) are not connected to the first analog test bus (e.g., are in high-Z), e.g., to avoid contention of the first analog test bus. During step 204, an output of a second DAC (e.g., one of the DACs from DAC modules $106_1$ to $106_L$) is connected to a second analog test bus (e.g., 164), e.g., via a demultiplexer (e.g., 129) while the outputs of the other DACs (e.g., of DAC modules 106) are not connected to the second analog test bus (e.g., are in high-Z), e.g., to avoid contention of the second analog test bus. In some embodiments, the ADCs 134 and comparators 144 are configured to ignore inputs for the analog test buses 162 and 164 during steps 204, 206 and 208. As will be described in more detail below, in some embodiments, one or more (or all) the ADCs 134 and/or comparators 144 are configured to use inputs from the analog test buses 162 and 164 during steps 204, 206 and 208 to test the one or more (or all) ADCs 134 and/or comparators 144 (e.g., in parallel).

During step 206, respective digital inputs are provided to the first and second DACs (e.g., via respective MUXes 126). In some embodiments, the digital inputs are provided to the first and second DACs by a test controller (e.g., 110). In some embodiments, the digital inputs are provided to the first and second DACs by an ATE. In some embodiments, the digital inputs provided to the first and second DACs are the same. In some embodiments, the digital inputs provided to the first and second DACs are different.

During step 208, the outputs of the first and second DACs are respectively observed at the first and second analog test buses. For example, in some embodiments, the outputs of the first and second DACs are respectively observed (e.g., by an ATE) at a first pad or pin (e.g., 152) and a second pad or pin (e.g., 154) that are respectively coupled to the first and second analog test buses. As will be described in more detail below, in some embodiments, the outputs of the first and second DACs are respectively observed by an ADC (e.g., 134).

During step 210, it is determined based on the outputs of the first and second DACs whether the first or second DACs have a fault. For example, in some embodiments, an ATE or test controller 110 observing the output of the first (or second) DAC may determine whether the first (or second) DAC has a fault based on the observed output and the input of the first (or second) DAC. In some embodiments, if a fault is detected during step 210, a flag is asserted (e.g., by the test controller).

As illustrated by steps 212 and 214, in some embodiments, steps 202, 204, 206, and 208 may be performed for each pair of DACs of IC 100. In some embodiments, steps 202, 204, 206 and 208 may be performed for a single DAC at a time.

As illustrated in FIG. 2, in some embodiments, two DACs of IC 100 may be advantageously tested in parallel, and pairs of DACs may be tested, e.g., sequentially, using only two analog test buses and advantageously without using any dedicated analog test pin.

Figure 3:
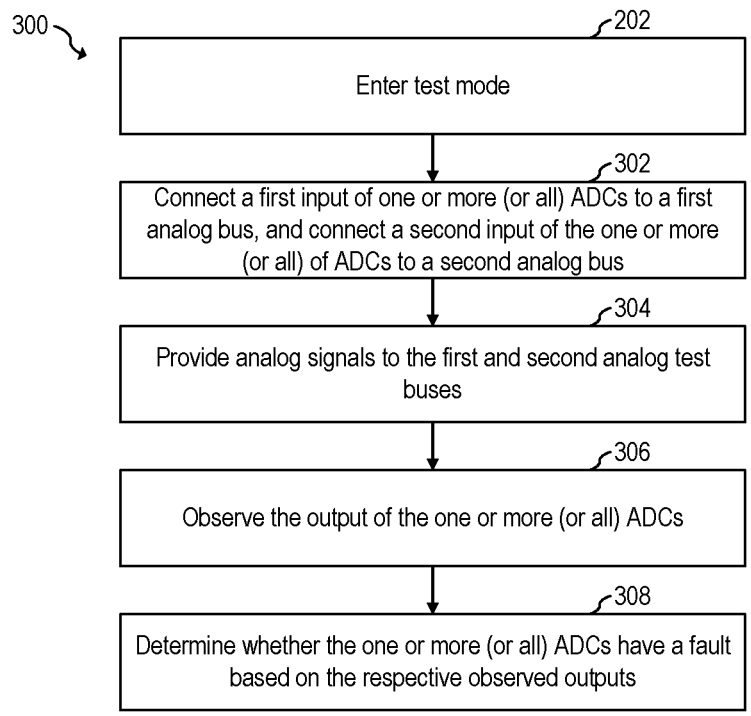
FIG. 3 illustrates a flow chart of an embodiment method for testing a plurality of ADCs of the IC of FIG. 1 in parallel, according to an embodiment of the present invention.

FIG. 3 illustrates a flow chart of embodiment method 300 for testing a plurality of ADCs of IC 100 in parallel, according to an embodiment of the present invention. Method 300 includes steps 202, 302, 304, 306, and 308. In some embodiments, step 202 may be performed in a similar manner as described with respect to method 200. In some embodiments, steps 302, 304, 306, and 308 may be performed by or using test controller 110. In some embodiments, one or more of steps 302, 304, 306, and 308 may be performed or caused to be performed by an ATE.

During step 302, first and second inputs of one or more (or all) ADCs of ADC modules $104_1$ to $104_M$) are connected to a first (e.g., 162) and second (e.g., 164) analog test buses, respectively, e.g., via respective first (e.g., 136) and second (e.g., 138) MUXes. As will be described in more detail below, in some embodiments, first and second inputs of one or more (or all) comparators of comparator modules $108_1$ to $108_P$) are connected to the first and second analog test buses, respectively during step 302.

During step 304, analog signals (e.g., voltages) are provided to the first and second analog test buses. For example, in some embodiments, the analog signals are provided to the first and second analog test buses via pads or pins 152 and 154, respectively, e.g., using an ATE. In some embodiments, the analog signals are provided to the first and second analog test buses using a DAC 124 having an output coupled to the first analog test bus, and a DAC 124 having an output coupled to the second analog test bus.

During step 306, the outputs of the one or more (or all) ADCs are respectively observed. For example, in some embodiments, the outputs of the one or more (or all) ADCs are routed to a test controller (e.g., 110) and are observed by the test controller. In some embodiments, the outputs of the one or more (or all) ADCs are routed to one or more registers of IC 100 and are observed by an ATE or main controller of IC 100 by accessing such registers. In some embodiments, such registers are located inside DFT logic circuit 132. In some embodiments, the outputs of the one or more (or all) ADCs are routed to digital pads (not shown), and accessed by the ATE.

During step 308, it is determined (e.g., by the test controller, main controller or ATE) whether the one or more (or all) ADCs have a fault based on the outputs of the one or more (or all) ADCs. In some embodiments, if a fault is detected during step 308, a flag is asserted (e.g., by the test controller).

In some embodiments in which ADCs 134 are implemented as a single-ended ADC, the ADCs 134 may be tested using only a single analog test bus.

As illustrated in FIG. 3, in some embodiments, a plurality or all differential ADCs of IC 100 may be advantageously tested in parallel using only two analog test buses and advantageously without using any dedicated analog test pin. In some embodiments, a plurality or all single-ended ADCs of IC 100 may be advantageously tested in parallel using only one analog test bus and advantageously without using any dedicated analog test pin. In some embodiments in which the inputs to the ADCs under test are provided by DAC(s) of IC 100, the ADCs may advantageously be tested on the field and without using an ATE.

Figure 4:
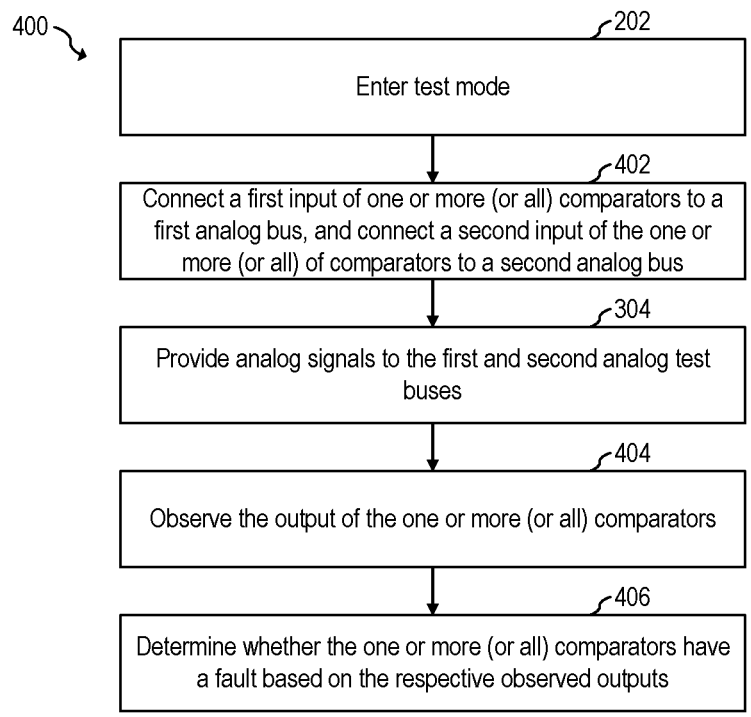
FIG. 4 illustrates a flow chart of an embodiment method for testing a plurality of comparators of the IC of FIG. 1 in parallel, according to an embodiment of the present invention.

FIG. 4 illustrates a flow chart of embodiment method 400 for testing a plurality of comparators of IC 100 in parallel, according to an embodiment of the present invention. Method 400 includes steps 202, 402, 304, 404, and 406. In some embodiments, steps 202 and 304 may be performed in a similar manner as described with respect to methods 200 and 300. In some embodiments, steps 402, 404, and 406 may be performed by or using test controller 110. In some embodiments, one or more of steps 402, 404, and 406 may be performed or caused to be performed by an ATE.

During step 402, first and second inputs of one or more (or all) comparators of comparator modules $108_1$ to $108_P$) are connected to a first (e.g., 162) and second (e.g., 164) analog test buses, respectively, e.g., via respective first (e.g., 146) and second (e.g., 148) MUXes. In some embodiments, first and second inputs of one or more (or all) ADCs of ADC modules $104_1$ to $104_M$) are connected to the first and second analog test buses, respectively during step 402.

During step 404 and after performing step 304, the outputs of the one or more (or all) comparators are respectively observed. For example, in some embodiments, the outputs of the one or more (or all) comparators are routed to a test controller (e.g., 110) and are observed by the test controller. In some embodiments, the outputs of the one or more (or all) comparators are routed to one or more registers of IC 100 and are observed by an ATE or main controller of IC 100 by accessing such registers. In some embodiments, such registers are located inside DFT logic circuit 142. In some embodiments, the outputs of the one or more (or all) comparators are routed to digital pads (not shown), and accessed by the ATE.

During step 406, it is determined (e.g., by the test controller, main controller or ATE) whether the one or more (or all) comparators have a fault based on the outputs of the one or more (or all) comparators. In some embodiments, if a fault is detected during step 406, a flag is asserted (e.g., by the test controller).

In some embodiments in which one of the inputs of comparator 144 is fixed (e.g., a fixed threshold, the comparators 144 may be tested using only a single analog test bus.

As illustrated in FIG. 4, in some embodiments, a plurality or all comparators of IC 100 may be advantageously tested in parallel using one or at most two analog test buses and advantageously without using any dedicated analog test pin. In some embodiments in which the inputs to the comparators under test are provided by DAC(s) of IC 100, the comparators may advantageously be tested on the field and without using an ATE.

Figure 5:
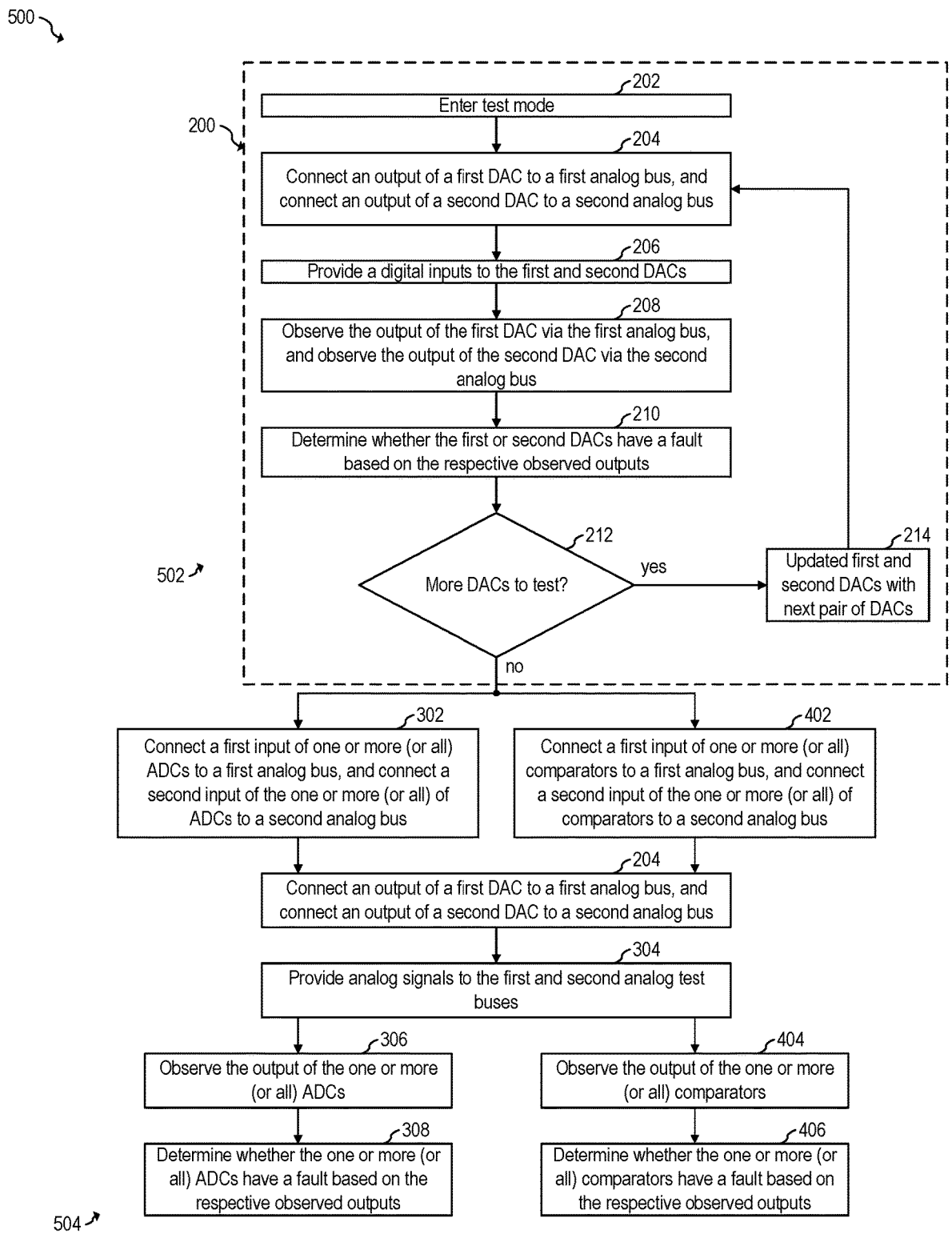
FIGS. 5 and 6 illustrate flow charts of embodiment methods for testing a plurality of DACs, ADCs, and comparators of the IC of FIG. 1, according to embodiments of the present invention.

FIG. 5 illustrates a flow chart of embodiment method 500 for testing a plurality of DACs, ADCs, and comparators of IC 100, according to an embodiment of the present invention. Method 500 includes steps 502 and 504. Step 502 includes steps 202, 204, 206, 208, 210, 212, and 214. Step 504 includes steps 204, 302, 304, 306, 308, 402, 404, and 406. In some embodiments, steps 202, 204, 206, 208, 210, 212, 214, 302, 304, 306, 308, 402, 404, and 406 may be performed in similar manner as described with respect to methos methods 200, 300, and 400.

In some embodiments, during step 502, the DACs of IC 100 are tested, e.g., using an ATE (e.g., for performing steps 208 and 210). Once the DACs of IC 100 are tested (and passed the test), the ADCs and comparators of IC 100 are tested in parallel during step 504 by providing the analog signals to the analog test buses using a (e.g., pair of) already tested (and good) DACs (e.g., in a BIST manner).

By using an ATE for testing the DACs during step 502, some embodiments advantageously allow for determining whether the DACs of IC 100 are good (e.g., ensure that the functionality and electrical parameters of such DACs meet expectations). By using already tested and good DACs for testing all ADCs and comparators of IC 100, some embodiments advantageously determine whether any of the ADCs and comparators have a fault in a parallel manner and without using an ATE (which may cause the test to be performed faster than when using an ATE). In some embodiments, using an already tested and good DAC of IC 100 to test an ADC of IC 100 has the additional advantage of cross-checking the BIST with an ATE by comparing results of step 504 (from step 308) with the results of step 502 (from step 210).

In some embodiments, such as in embodiments in which the ADCs 134 are single-ended ADCs and the comparators 144 have one of the inputs fixed, method 500 may be performed with a single analog test bus and without using a dedicated analog test pin.

As illustrated in FIG. 5, some embodiments advantageously test all of DACs, ADCs, and comparators of IC 100 using one or at most two analog test buses and without using a dedicated analog test pin or pad.

Figure 6:
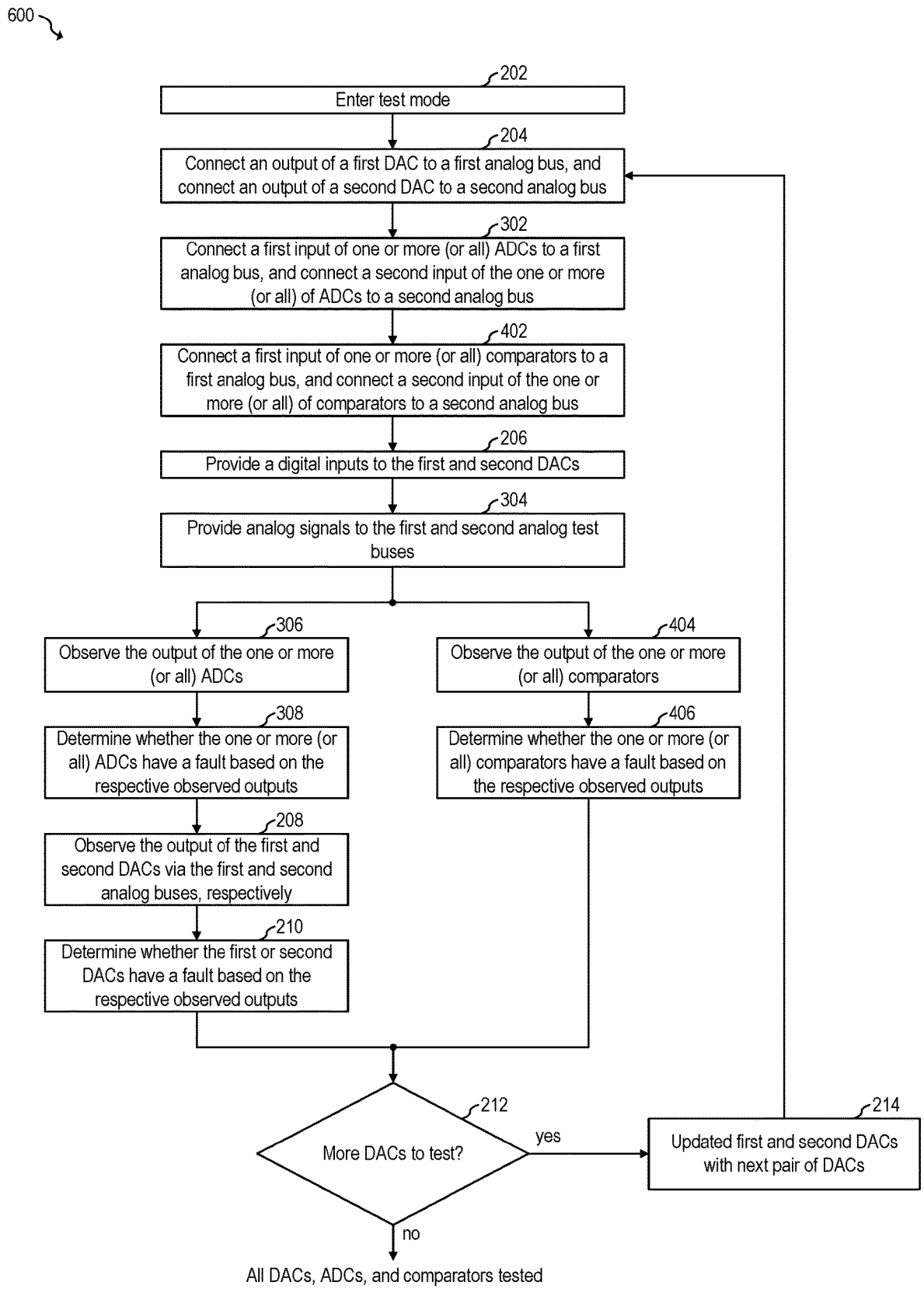

FIG. 6 illustrates a flow chart of embodiment method 600 for testing a plurality of DACs, ADCs, and comparators of IC 100, according to an embodiment of the present invention. Method 600 includes steps 202, 204, 206, 208, 210, 212, 214, 302, 304, 306, 308, 402, 404, and 406. In some embodiments, steps 202, 204, 206, 208, 210, 212, 214, 302, 304, 306, 308, 402, 404, and 406 may be performed in similar manner as described with respect to methos 200, 300, and 400.

As shown in FIG. 6, the one or more (or all) ADCs and comparators are repeatedly tested with different pairs of DACs. In some embodiments, repeatedly testing the same ADCs and/or comparators with different pairs of DACs advantageously allows for detecting faults in one or more of DACs, ADCs, and comparators in a BIST manner and without using an ATE. For example, if, when testing a first pair of DACs, the test of all ADCs fails (steps 308) and when testing a second pair of DACs, the tests of all ADCs pass (step 308), then it may be determined during step 210 that the first pair of DACs has a fault. In some embodiments, if the same ADC fails the test (during step 308) during multiple pair of DACs tests, then, it may be determined during step 308 that such ADC has a fault.

Advantages of some embodiments include satisfying at the same time constraints in terms of number of pins or pads which can be used for testing at a given step in a test flow (during characterization, production, or in the field), and the number of required signals to be controlled/observed, possibly with the best test parallelism achievable. By testing analog circuits (e.g., ADCs, DACs, and comparators) of an IC without using dedicated analog test pins or pads, some embodiments advantageously allow for testing of such analog circuits in pin or pad-limited devices. Some embodiments advantageously achieve internal testing (using BIST) of such analog circuits without using an ATE. Some embodiments advantageously achieve a high degree of test parallelism (e.g., by testing all ADCs and comparators in parallel), which may advantageously reduce test time.

In some embodiments, by using instances of the same analog circuit design (e.g., 102/106, 104, 108) that includes DFT logic circuits, some embodiments advantageously achieve scalability and simplify signal routing and congestion. For example, in some embodiments, the use of a common analog bus advantageously simplifies the routing of analog signals. In some embodiments, the tight physical coupling of the DFT logic circuits with their respective modules advantageously simplifies the routing of module configuration signals.

In some embodiments (e.g., as shown in FIG. 1), each of DAC modules 102 and 106 corresponds to instances of the same DAC module design, each of ADC modules 104 corresponds to instances of the same ADC module design, and each of comparator modules 108 corresponds to instances of the same comparator module design. By incorporating the DFT logic circuit (e.g., 122, 132, 142), MUXes (126, 136, 138, 146, 148) and demultiplexers (e.g., 129, 139, 149) inside the design of the analog circuit (e.g., 102, 104, 106, 108), some embodiments advantageously achieve portability of DFT solution from a generation of devices to the next one or across different devices, thereby advantageously contributing to reduce product development time and make the device design and test program development more efficient).

In some embodiments, the DFT logic circuits associated with modules 102, 104, 106, and 108 are implemented as a digital block build around their associated module. For example, the analog module (e.g., 102, 104, 106, and 108) may be designed first, and then, a DFT digital circuit is attached to the already designed analog module. In such embodiments, modularity is achieved because it may be sufficient to instantiate the associated DFT logic circuit many times around the respective instantiation of the associated analog module to achieve testability.

Figure 7:
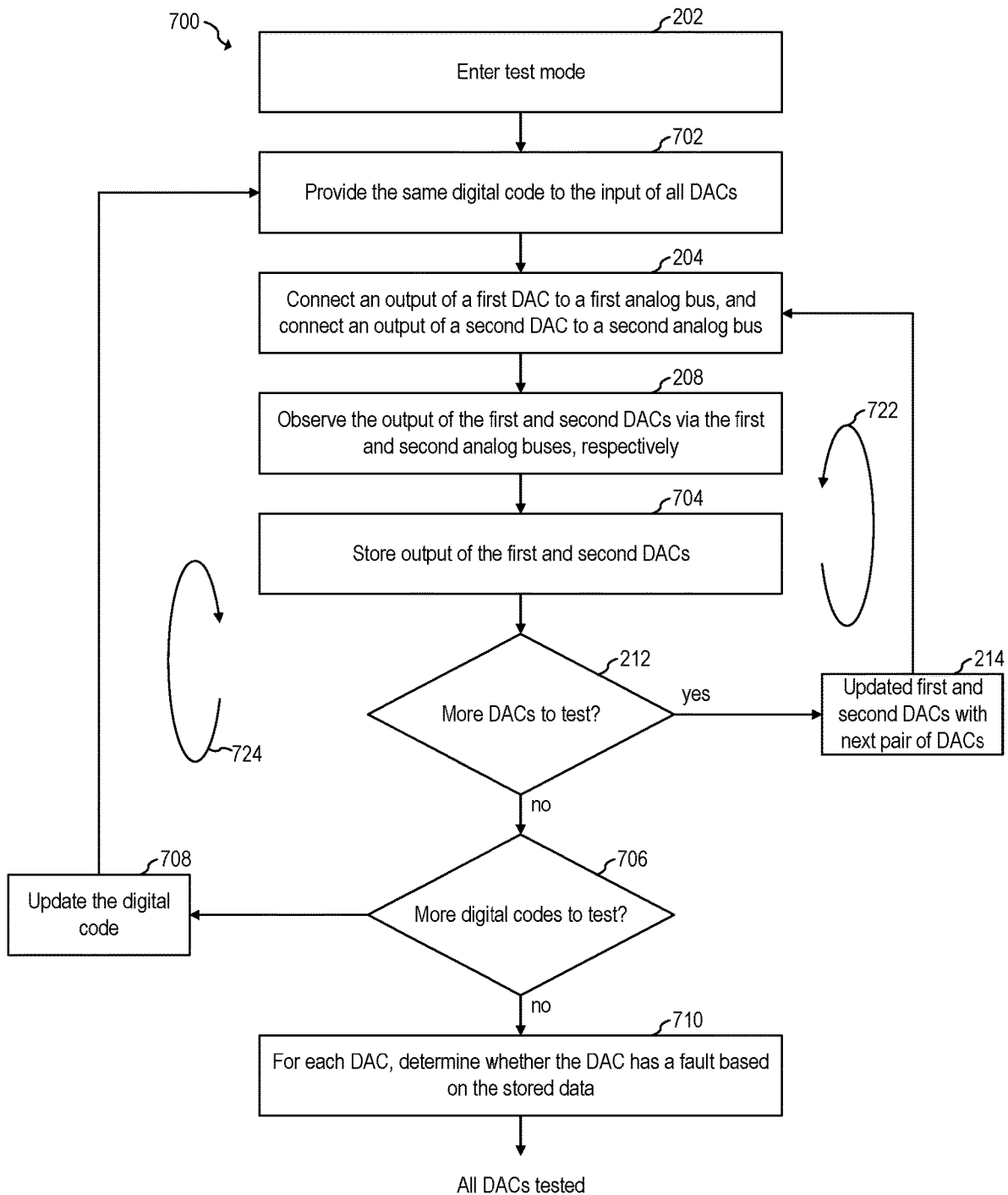
FIG. 7 illustrates a flow chart of an embodiment method for testing a plurality of DACs of the IC of FIG. 1, according to an embodiment of the present invention.

As illustrated by FIGS. 2, 5, and 6, in some embodiments, two DACs of IC 100 may be tested in parallel with two analog test buses. In some embodiments, 2, 3, or more DACs of IC 100 may be tested in parallel with a single analog test bus. For example, FIG. 7 illustrates a flow chart of embodiment method 700 for testing a plurality of DACs of IC 100, according to an embodiment of the present invention. Method 700 includes steps 202, 204, 208, 212, 214, 702, 704, 706, 708, and 710. In some embodiments, steps 202, 204, 208, 212, and 214 may be performed in a similar manner as described with respect to method 200. In some embodiments, steps 702, 704, 706, 708, and 710 may be performed by or using test controller 110. In some embodiments, one or more of steps 702, 704, 706, 708, and 710 may be performed or caused to be performed by an ATE.

During step 702, the same digital code is provided to the input of all DACs (e.g., to all DACs 124 of all DAC modules 102 and 106), e.g., via a MUX (e.g., 126). In some embodiments, the digital codes are provided to all DACs by a test controller (e.g., 110). In some embodiments, the digital codes are provided to all DACs by an ATE.

After connecting a first pair of DACs to the first (e.g., 162) and second (e.g., 164) analog test buses during step 204, the outputs generated by the first pair of DACs are observed during step 208 and stored in during step 704. In some embodiments, the outputs are observed by one or more ADCs 134 (via the analog test buses) and stored in a memory of the test controller. In some embodiments, the outputs are observed by the ATE (via the analog test buses) and stored in the ATE.

As illustrated by loop 722 (which includes steps 204, 208, 704, 212 and 214), all pairs of DACs are iterated through with their respective outputs stored in memory for the same digital code.

As illustrated by loop 724 (which includes steps 706 and 708), after all DACs are tested with a first digital codes, all DACs are then tested with a new digital code until all DACs are tested with all selected digital codes. For example, in some embodiments, the digital codes form a digital ramp that starts, e.g., at code R, and ends at code Q. In some embodiments, R and Q corresponds to the minimum and maximum input codes of the DACs, respectively. For example, for an 8-bit DAC, the minimum input code may be o and the maximum input code may be 255. In some embodiments, Q is lower than the maximum input code of the DACs and R is higher than the minimum input code of the DACs.

In some embodiments, during step 708, the digital codes are updated monotonically (e.g., increasing or decreasing, e.g., in a ramp) starting from code R (or Q) and ending in code Q (or R). In some embodiments, each code between R and Q is tested (each update during step 708 changes the digital code by 1). In some embodiments, not every code between R and Q is tested (e.g., each update during step 708 changes the digital code by more than 1).

Once the outcome of step 706 is "no," it is determined during step 710, for each DAC, whether a DAC has a fault based on the data stored during execution of the respective step 704.

In some embodiments, loop 722 is performed by rapidly switching demultiplexers 129 (e.g., at a rate of tens of KHz, such as between 10 KHz and 100 kHz) to connect and disconnect DACs 124 to select the desired pair of DACs 124, and loop 724 is performed by rapidly updating the digital code monotonically. In such embodiments, voltage at the analog test buses may resemble (or be) a voltage ramp and the settling time before making an observation (measurement) during step 208 may be minimized since the voltage at the analog test buses is already at or near the settled value. Thus, in some embodiments, a plurality of DACs (e.g., all DACs of DAC modules 102) may be advantageously tested in parallel using analog test bus 162 and method 700, and a plurality of DACs (e.g., all DACs of DAC modules 106) may be advantageously tested in parallel using analog test bus 164 and method 700.

In some embodiments, method 500 may be adapted to incorporate the parallel testing illustrated by method 700. For example, in some embodiments, step 502 may be performed as method 700.

Figure 8:
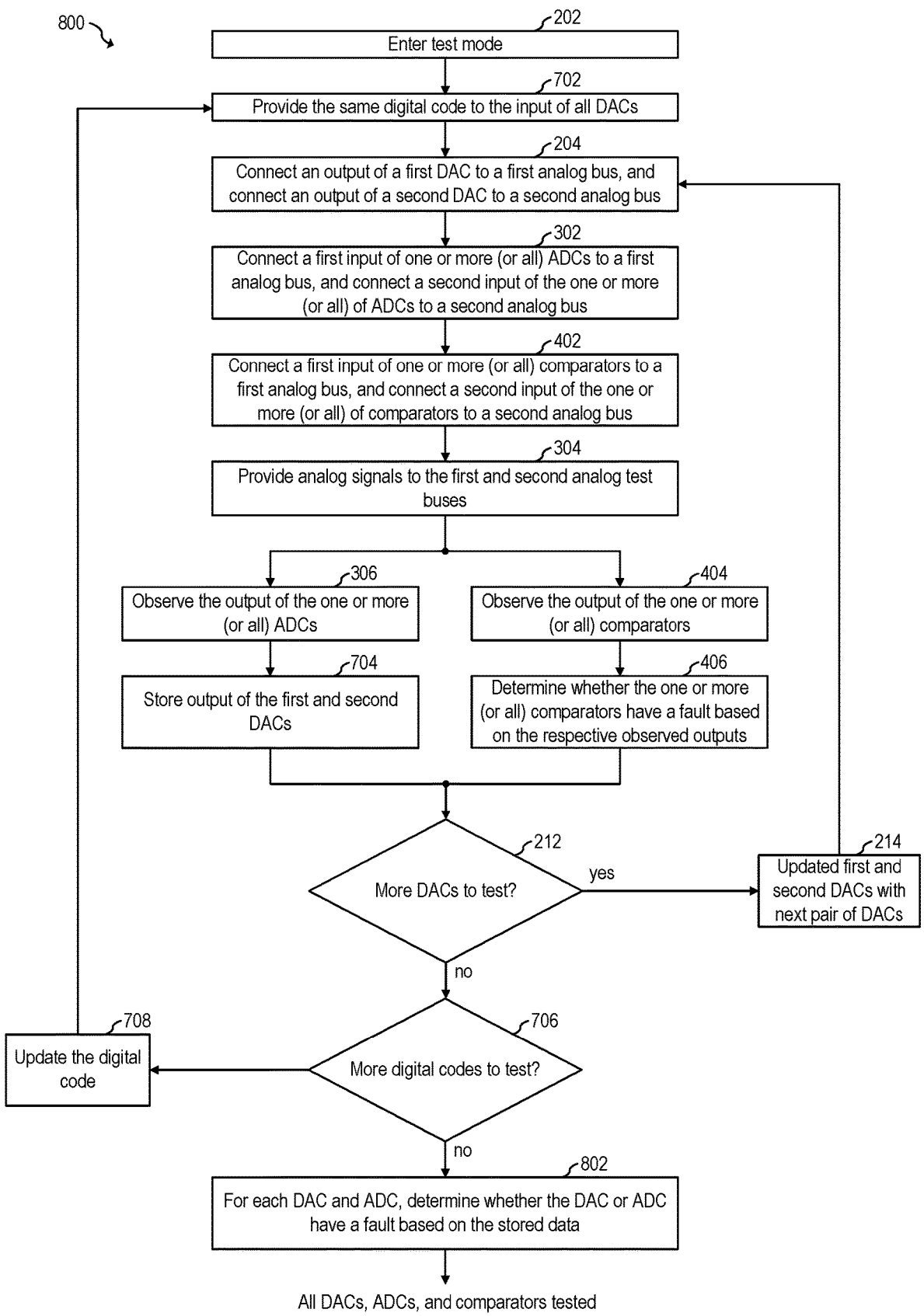
FIG. 8 illustrates a flow chart of an embodiment method for testing a plurality of DACs, ADCs, and comparators of the IC of FIG. 1, according to an embodiment of the present invention.

In some embodiments, methods 600 may be adapted to incorporate the parallel testing illustrated by method 700. For example, FIG. 8 illustrates a flow chart of embodiment method 800 for testing a plurality of DACs, ADCs, and comparators of IC 100, according to an embodiment of the present invention. Method 800 includes steps 202, 204, 212, 214, 302, 304, 306, 402, 404, 406, 702, 704, 706, 708 and 802. In some embodiments, steps 202, 204, 212, 214, 302, 304, 306, 402, 404, 406, 702, 704, 706, and 708 may be performed in similar manner as described with respect to methods 200, 300, 400, and 700.

As shown in FIG. 8, method 800 operates in a similar manner as method 600 but tests the plurality of DACs simultaneously instead of testing pairs of DACs sequentially. During method 800, the outputs of the DACs are observed by observing the outputs of the one or more (or all) ADCs during step 306, and such outputs are stored during step 704.

Once the outcome of step 706 is "no," it is determined during step 802, for each DAC and ADC pair, whether the DAC or ADC has a fault based on the data stored during execution of the respective step 704.

Advantages of some embodiments include the reusing of a functional pin or pad for providing test capabilities to analog circuits (e.g., DACs, ADCs, and/or comparators) without using a dedicated analog test pin, thus, advantageously allowing for zero overhead in terms of no additional analog test pin required for adding testability for such analog circuits. Additional advantages of some embodiments include the testing of a plurality of DACs using a single shared analog test bus in a quasi-parallel manner by rapidly sequentially switching the outputs of the plurality of DACs while ramping the input codes of all DACs simultaneously.

Other advantages of some embodiments include the ability to cross-check results between ATE and BIST type testing (e.g., by measuring analog signals with the ATE from the analog test bus and comparing the measured result with outputs of the ADC).

Example embodiments of the present invention are summarized here. Other embodiments can also be understood from the entirety of the specification and the claims filed herein.

Example 1. An integrated circuit including: a first functional analog pin or pad; a first analog test bus coupled to the first functional analog pin or pad; a first analog circuit coupled to the first analog test bus; a second analog circuit coupled to the first analog test bus; and a test controller configured to: when the integrated circuit is in a functional operating mode, connect an input or output of the first analog circuit to the first analog test bus so that the input or output of the first analog circuit is accessible by the first functional analog pin or pad, and keep disconnected an input or output of the second analog circuit from the first analog test bus, and when the integrated circuit is in a test mode, selectively connect the input or output of the first and second analog circuits to the first analog test bus to test the first and second analog circuits using the first analog test bus.

Example 2. The integrated circuit of example 1, further including a plurality of digital-to-analog converters (DACs) having respective outputs coupled to the first analog test bus, where the first analog circuit or the second analog circuit includes a DAC of the plurality of DACs, and where, when the integrated circuit is in the test mode, the test controller is configured to: provide a same first digital code to respective inputs of each of the plurality of DACs; sequentially for each of the plurality of DACs, connect the output of the respective DAC to the first analog test bus so that the respective DAC provides a respective first analog signal to the first analog test bus, and disconnect the respective output of the respective DAC from the first analog test bus after the respective DAC provides the respective first analog signal to the first analog test bus; and determine whether one or more DACs of the plurality of DACs has a fault based on the first analog signals provided to the first analog test bus.

Example 3. The integrated circuit of one of examples 1 or 2, further including a first analog-to-digital converter (ADC) having an input coupled to the first analog test bus, where, when the integrated circuit is in the test mode, the test controller is further configured to: for each of the plurality of DACs, measure the respective first analog signal at the first analog test bus using the first ADC, where the test controller is configured to determine whether one or more DACs of the plurality of DACs has a fault based on an output of the first ADC.

Example 4. The integrated circuit of one of examples 1 to 3, further including a plurality of digital-to-analog converters (DACs) having respective outputs coupled to the first analog test bus, where, when the integrated circuit is in the test mode, the test controller is configured to: provide to respective inputs of the plurality of DACs a monotonical sequence of digital codes, where the test controller is configured to provide each of the digital codes of the monotonical sequence of digital codes simultaneously to the respective inputs of each of the plurality of DACs; for each of the digital codes of the monotonical sequence of digital codes, sequentially for each of the plurality of DACs, connect the respective output of the respective DAC to the first analog test bus so that the respective DAC provides a respective first analog signal to the first analog test bus, and disconnect the respective output of the respective DAC from the first analog test bus after the respective DAC provides the respective analog signal to the first analog test bus; and determine whether one or more DACs of the plurality of DACs has a fault based on the first analog signals provided to the first analog test bus.

Example 5. The integrated circuit of one of examples 1 to 4, where the first analog circuit or the second analog circuit includes a DAC of the plurality of DACs.

Example 6. The integrated circuit of one of examples 1 to 5, further including a plurality of analog-to-digital converters (ADCs) having respective inputs coupled to the first analog test bus, where, when the integrated circuit is in the test mode, the test controller is further configured to: for each of the plurality of DACs and for each of the digital codes of the monotonical sequence of digital codes, measure the respective first analog signal at the first analog test bus using the plurality of ADCs, where the test controller is configured to determine whether one or more DACs of the plurality of DACs has a fault based on an output of the plurality of ADCs.

Example 7. The integrated circuit of one of examples 1 to 6, where the test controller is further configured to determine whether one or more ADCs of the plurality of ADCs has a fault based on the output of the plurality of ADCs.

Example 8. The integrated circuit of one of examples 1 to 7, where the first analog circuit or the second analog circuit includes an ADC of the plurality of ADCs.

Example 9. The integrated circuit of one of examples 1 to 8, further including a plurality of analog-to-digital converters (ADCs) having first inputs coupled to the first analog test bus, a plurality of digital-to-analog converters (DACs) having outputs coupled to the first analog test bus, and a plurality of comparators having first inputs coupled to the first analog test bus, where the first analog circuit or the second analog circuit includes a DAC of the plurality of DACs, and ADC of the plurality of ADCs, or a comparator of the plurality of comparators, where the test controller is configured to: connect an output of a first DAC of the plurality of DACs to the first analog test bus; connect the respective first inputs of each of the plurality of ADCs to the first analog test bus; and connect the respective first inputs of each of the plurality of comparators to the first analog test bus; while the first inputs of the plurality of ADCs and the first inputs of the plurality of comparators are connected to analog test bus, provide an analog signal to the first analog test bus with the output of the first DAC; and determine whether one or more ADCs of the plurality of ADCs has a fault based on respective outputs of the plurality of ADCs; and determine whether one or more comparators of the plurality of comparators has a fault based on respective outputs of the plurality of comparators.

Example 10. The integrated circuit of one of examples 1 to 9, further including: a plurality of DAC modules, each of the plurality of DAC modules including a respective DAC of the plurality of DACs, and a design for testability (DFT) logic circuit; a plurality of ADC modules, each of the plurality of ADC modules including a respective ADC of the plurality of ADCs, and a DFT logic circuit; and a plurality of comparator modules, each of the plurality of comparator modules including a respective comparator of the plurality of comparators, and a DFT logic circuit, where the test controller includes outputs coupled to respective inputs of the DFT logic circuits of the plurality of DAC modules, the plurality of ADC modules, and the plurality of comparator modules, and where the test controller is configured to: connect the output of the first DAC to the first analog test bus using the DFT logic circuit of the DAC module including the first DAC; connect the respective first inputs of each of the plurality of ADCs to the first analog test bus using respective DFT logic circuits of the plurality of ADC modules, and connect the respective first inputs of each of the plurality of comparators to the first analog test bus using respective DFT logic circuits of the plurality of comparator modules.

Example 11. The integrated circuit of one of examples 1 to 10, where each of the plurality of DAC modules is an instance of the same DAC design, each of the plurality of ADC modules is an instance of the same ADC design, and each of the plurality of comparator modules is an instance of the same comparator module design.

Example 12. The integrated circuit of one of examples 1 to 11, further including a plurality of DAC modules, each of the plurality of DAC modules including a respective DAC of a plurality of DACs, and a demultiplexer having an input coupled to an output of the respective DAC, where the first analog circuit includes a first DAC module of the plurality of DAC modules, where the demultiplexer of the first DAC module includes a first output coupled to the first analog test bus, and a second output shorted to the first output, and where the demultiplexer of a second DAC module of the plurality of DAC modules includes a first output coupled to the first analog test bus and a second output coupled to a functional internal node of the integrated circuit.

Example 13. The integrated circuit of one of examples 1 to 12, further including: a second functional analog pin or pad; a second analog test bus coupled to the second functional analog pin or pad; a third analog circuit coupled to the second analog test bus; and a fourth analog circuit coupled to the second analog test bus, where the test controller is configured to: when the integrated circuit is in the functional operating mode, connect an input or output of the third analog circuit to the second analog test bus so that the input or output of the third analog circuit is accessible by the second functional analog pin or pad, and keep disconnected an input or output of the fourth analog circuit from the second analog test bus, and when the integrated circuit is in the test mode, test the third analog circuit using the second analog test bus, connect the input or output of the fourth analog circuit to the second analog test bus, and test the fourth analog circuit using the first analog test bus.

Example 14. The integrated circuit of one of examples 1 to 13, further including a first digital-to-analog converter (DAC) having an output coupled to the first analog test bus, a second DAC having an output coupled to the second analog test bus, and a differential analog-to-digital converter (ADC) having a first input coupled to the first analog test bus and a second input coupled to the second analog test bus, where, when the integrated circuit is in the test mode, the test controller is configured to: connect the output of the first DAC to the first analog test bus; connect the output of the second DAC to the second analog test bus; connect the first and second inputs of the differential ADC to the first and second analog test buses, respectively; provide a first analog signal to the first analog test bus using the first DAC; provide a second analog signal to the second analog test bus using the second DAC; and determine whether the differential ADC has a fault based on an output of the differential ADC.

Example 15. The integrated circuit of one of examples 1 to 14, where the first analog circuit includes a first buffered digital-to-analog converter (DAC) having an output coupled to the first analog test bus, and where, during the functional operating mode, an output of the first buffered DAC is connected to the first functional analog pin or pad and is configured to provide an analog signal to the first functional analog pin or pad based on an input of the first buffered DAC.

Example 16. The integrated circuit of one of examples 1 to 15, where the second analog circuit includes a second unbuffered DAC having an output coupled to the first analog test bus.

Example 17. The integrated circuit of one of examples 1 to 16, where the second analog circuit includes an analog-to-digital converter (ADC) or comparator having an input coupled to the first analog test bus.

Example 18. The integrated circuit of one of examples 1 to 17, where the first analog circuit includes a first analog-to-digital converter (ADC) having an input coupled to the first analog test bus.

Example 19. The integrated circuit of one of examples 1 to 18, where the second analog circuit includes a digital-to-analog converter (DAC) having an output coupled to the first analog test bus, a second ADC having an input coupled to the first analog test bus, or a comparator having an input coupled to the first analog test bus.

Example 20. The integrated circuit of one of examples 1 to 19, where the integrated circuit is disposed in a printed circuit board (PCB), and where the first functional analog pin or pad is not connected to a ground plane of the PCB.

Example 21. The integrated circuit of one of examples 1 to 20, where the integrated circuit includes the first functional pad coupled to the first functional analog pin via a bond wire.

Example 22. An integrated circuit including: first and second functional analog pins or pads; first and second analog test buses respectively coupled to the first and second functional analog pins or pads; a first digital-to-analog converter (DAC) having an output coupled to the first analog test bus; a second DAC having an output coupled to the second analog test bus; a differential analog-to-digital converter (ADC) having a first input coupled to the first analog test bus and a second input coupled to the second analog test bus; and a test controller configured to: when the integrated circuit is in a functional operating mode, connect the output of the first DAC to the first analog test bus so that the output of the first DAC is accessible by the first functional analog pin or pad, connect the output of the second DAC to the second analog test bus so that the output of the second DAC is accessible by the second functional analog pin or pad, and keep disconnected the first and second inputs of the differential ADC from the first and second analog test buses, respectively, and when the integrated circuit is in a test mode, connect the first and second inputs of the differential ADC to the first and second analog test buses, respectively, provide first and second analog signals to the first and second analog test buses using the first and second DACs, respectively, and determine whether the first DAC, the second DAC, or the differential ADC has a fault based on an output of the differential ADC.

Example 23. A method including: when an integrated circuit is in a non-test mode, connect an input or output of a first analog circuit to a first analog test bus that is coupled to a first functional analog pin or pad so that the input or output of the first analog circuit is accessible by the first functional analog pin or pad, and keep disconnected an input or output of a second analog circuit from the first analog test bus; and when the integrated circuit is in a test mode, selectively connect the input or output of the first and second analog circuits to the first analog test bus to test the first and second analog circuits using the first analog test bus.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
   a first functional analog pin or pad;
   a first analog test bus coupled to the first functional analog pin or pad;
   a plurality of analog-to-digital converters (ADCs) having first inputs coupled to the first analog test bus;
   a plurality of digital-to-analog converters (DACs) having outputs coupled to the first analog test bus;
   a plurality of comparators having first inputs coupled to the first analog test bus:
   a first analog circuit coupled to the first analog test bus, the first analog circuit comprising a DAC of the plurality of DACs, an ADC of the plurality of ADCs, or a comparator of the plurality of comparators;
   a second analog circuit coupled to the first analog test bus; and
   a test controller configured to:
   when the integrated circuit is in a functional operating mode, connect an input or output of the first analog circuit to the first analog test bus so that the input or output of the first analog circuit is accessible by the first functional analog pin or pad, and keep disconnected an input or output of the second analog circuit from the first analog test bus,
   when the integrated circuit is in a test mode, selectively connect the input or output of the first and second analog circuits to the first analog test bus to test the first and second analog circuits using the first analog test bus connect the respective first inputs of each of the plurality of comparators to the first analog test bus,
   provide an analog signal to the first analog test bus with the output of a first DAC in response to the first inputs of the plurality of ADCs and the first inputs of the plurality of comparators being connected to the first analog test bus, and
   determine whether a comparator has a fault based on respective outputs of the plurality of comparators.

2. The integrated circuit of claim 1, wherein the first analog circuit or the second analog circuit comprises a DAC of the plurality of DACs, and wherein, when the integrated circuit is in the test mode, the test controller is configured to:
   provide a same first digital code to respective inputs of each of the plurality of DACs;
   sequentially for each of the plurality of DACs, connect the output of the respective DAC to the first analog test bus so that the respective DAC provides a respective first analog signal to the first analog test bus, and disconnect the respective output of the respective DAC from the first analog test bus after the respective DAC provides the respective first analog signal to the first analog test bus; and
   determine whether one or more DACs of the plurality of DACs has a fault based on the first analog signals provided to the first analog test bus.

3. The integrated circuit of claim 2, further comprising a first analog-to-digital converter (ADC) having an input coupled to the first analog test bus, wherein, when the integrated circuit is in the test mode, the test controller is further configured to:
   for each of the plurality of DACs, measure the respective first analog signal at the first analog test bus using the first ADC, wherein the test controller is configured to determine whether one or more DACs of the plurality of DACs has a fault based on an output of the first ADC.

4. The integrated circuit of claim 1, wherein, when the integrated circuit is in the test mode, the test controller is configured to:
provide to respective inputs of the plurality of DACs a monotonical sequence of digital codes, wherein the test controller is configured to provide each of the digital codes of the monotonical sequence of digital codes simultaneously to the respective inputs of each of the plurality of DACs;
for each of the digital codes of the monotonical sequence of digital codes, sequentially for each of the plurality of DACs, connect the respective output of the respective DAC to the first analog test bus so that the respective DAC provides a respective first analog signal to the first analog test bus, and disconnect the respective output of the respective DAC from the first analog test bus after the respective DAC provides the respective analog signal to the first analog test bus; and
determine whether one or more DACs of the plurality of DACs has a fault based on the first analog signals provided to the first analog test bus.

5. The integrated circuit of claim 4, wherein the first analog circuit or the second analog circuit comprises a DAC of the plurality of DACs.

6. The integrated circuit of claim 4, wherein, when the integrated circuit is in the test mode, the test controller is further configured to:
for each of the plurality of DACs and for each of the digital codes of the monotonical sequence of digital codes, measure the respective first analog signal at the first analog test bus using the plurality of ADCs, wherein the test controller is configured to determine whether one or more DACs of the plurality of DACs has a fault based on an output of the plurality of ADCs.

7. The integrated circuit of claim 6, wherein the test controller is further configured to determine whether one or more ADCs of the plurality of ADCs has a fault based on the output of the plurality of ADCs.

8. The integrated circuit of claim 6, wherein the first analog circuit or the second analog circuit comprises an ADC of the plurality of ADCs.

9. The integrated circuit of claim 1, wherein the second analog circuit comprises a second DAC of the plurality of DACs, a second ADC of the plurality of ADCs, or a second comparator of the plurality of comparators, wherein the test controller is configured to:
connect an output of a first DAC of the plurality of DACs to the first analog test bus; and
connect the respective first inputs of each of the plurality of ADCs to the first analog test bus; and
determine whether one or more ADCs of the plurality of ADCs has a fault based on respective outputs of the plurality of ADCs.

10. The integrated circuit of claim 9, further comprising:
a plurality of DAC modules, each of the plurality of DAC modules comprising a respective DAC of the plurality of DACs, and a design for testability (DFT) logic circuit;
a plurality of ADC modules, each of the plurality of ADC modules comprising a respective ADC of the plurality of ADCs, and a DFT logic circuit; and
a plurality of comparator modules, each of the plurality of comparator modules comprising a respective comparator of the plurality of comparators, and a DFT logic circuit, wherein the test controller comprises outputs coupled to respective inputs of the DFT logic circuits of the plurality of DAC modules, the plurality of ADC modules, and the plurality of comparator modules, and wherein the test controller is configured to:
connect the output of the first DAC to the first analog test bus using the DFT logic circuit of the DAC module comprising the first DAC,
connect the respective first inputs of each of the plurality of ADCs to the first analog test bus using respective DFT logic circuits of the plurality of ADC modules, and
connect the respective first inputs of each of the plurality of comparators to the first analog test bus using respective DFT logic circuits of the plurality of comparator modules.

11. The integrated circuit of claim 10, wherein each of the plurality of DAC modules is an instance of the same DAC design, each of the plurality of ADC modules is an instance of the same ADC design, and each of the plurality of comparator modules is an instance of the same comparator module design.

12. The integrated circuit of claim 1, further comprising a plurality of DAC modules, each of the plurality of DAC modules comprising a respective DAC of a plurality of DACs, and a demultiplexer having an input coupled to an output of the respective DAC, wherein the first analog circuit comprises a first DAC module of the plurality of DAC modules, wherein the demultiplexer of the first DAC module comprises a first output coupled to the first analog test bus, and a second output shorted to the first output, and wherein the demultiplexer of a second DAC module of the plurality of DAC modules comprises a first output coupled to the first analog test bus and a second output coupled to a functional internal node of the integrated circuit.

13. The integrated circuit of claim 1, further comprising:
a second functional analog pin or pad;
a second analog test bus coupled to the second functional analog pin or pad;
a third analog circuit coupled to the second analog test bus; and
a fourth analog circuit coupled to the second analog test bus, wherein the test controller is configured to:
when the integrated circuit is in the functional operating mode, connect an input or output of the third analog circuit to the second analog test bus so that the input or output of the third analog circuit is accessible by the second functional analog pin or pad, and keep disconnected an input or output of the fourth analog circuit from the second analog test bus, and
when the integrated circuit is in the test mode, test the third analog circuit using the second analog test bus, connect the input or output of the fourth analog circuit to the second analog test bus, and test the fourth analog circuit using the first analog test bus.

14. The integrated circuit of claim 13, further comprising a first digital-to-analog converter (DAC) having an output coupled to the first analog test bus, a second DAC having an output coupled to the second analog test bus, and a differential analog-to-digital converter (ADC) having a first input coupled to the first analog test bus and a second input coupled to the second analog test bus, wherein, when the integrated circuit is in the test mode, the test controller is configured to:
connect the output of the first DAC to the first analog test bus;

connect the output of the second DAC to the second analog test bus;
connect the first and second inputs of the differential ADC to the first and second analog test buses, respectively;
provide a first analog signal to the first analog test bus using the first DAC;
provide a second analog signal to the second analog test bus using the second DAC; and
determine whether the differential ADC has a fault based on an output of the differential ADC.

15. The integrated circuit of claim 1, wherein the first analog circuit comprises a first buffered digital-to-analog converter (DAC) having an output coupled to the first analog test bus, and wherein, during the functional operating mode, an output of the first buffered DAC is connected to the first functional analog pin or pad and is configured to provide an analog signal to the first functional analog pin or pad based on an input of the first buffered DAC.

16. The integrated circuit of claim 15, wherein the second analog circuit comprises a second unbuffered DAC having an output coupled to the first analog test bus.

17. The integrated circuit of claim 15, wherein the second analog circuit comprises an analog-to-digital converter (ADC) or comparator having an input coupled to the first analog test bus.

18. The integrated circuit of claim 1, wherein the first analog circuit comprises a first analog-to-digital converter (ADC) having an input coupled to the first analog test bus.

19. The integrated circuit of claim 1, wherein the second analog circuit comprises a digital-to-analog converter (DAC) having an output coupled to the first analog test bus, a second ADC having an input coupled to the first analog test bus, or a comparator having an input coupled to the first analog test bus.

20. The integrated circuit of claim 1, wherein the integrated circuit is disposed in a printed circuit board (PCB), and wherein the first functional analog pin or pad is not connected to a ground plane of the PCB.

21. The integrated circuit of claim 1, wherein the integrated circuit comprises the first functional pad coupled to the first functional analog pin via a bond wire.

22. An integrated circuit comprising:
first and second functional analog pins or pads;
first and second analog test buses respectively coupled to the first and second functional analog pins or pads;
a first digital-to-analog converter (DAC) having an output coupled to the first analog test bus;
a second DAC having an output coupled to the second analog test bus;
a differential analog-to-digital converter (ADC) having a first input coupled to the first analog test bus and a second input coupled to the second analog test bus; and
a test controller configured to:
when the integrated circuit is in a functional operating mode, connect the output of the first DAC to the first analog test bus so that the output of the first DAC is accessible by the first functional analog pin or pad, connect the output of the second DAC to the second analog test bus so that the output of the second DAC is accessible by the second functional analog pin or pad, and keep disconnected the first and second inputs of the differential ADC from the first and second analog test buses, respectively, and
when the integrated circuit is in a test mode, connect the first and second inputs of the differential ADC to the first and second analog test buses, respectively, provide first and second analog signals to the first and second analog test buses using the first and second DACs, respectively, and determine whether the first DAC, the second DAC, or the differential ADC has a fault based on an output of the differential ADC.

23. A method comprising:
when an integrated circuit is in a non-test mode,
connect an input or output of a first analog circuit to a first analog test bus that is coupled to a first functional analog pin or pad so that the input or output of the first analog
circuit is accessible by the first functional analog pin or pad, and
keep disconnected an input or output of a second analog circuit from the first analog test bus;
when the integrated circuit is in a test mode, selectively connect the input or output of the first and second analog circuits to the first analog test bus to test the first and second analog circuits using the first analog test bus;
when the integrated circuit is in the functional operating mode, connect an input or output of a third analog circuit to a second analog test bus so that the input or output of the third analog circuit is accessible by a second functional analog pin or pad, and keep disconnected an input or output of a fourth analog circuit from the second analog test bus:
and when the integrated circuit is in the test mode, test the third analog circuit using the second analog test bus, connect the input or output of the fourth analog circuit to the second analog test bus, and test the fourth analog circuit using the first analog test bus.

* * * * *